(12) United States Patent
DeVore et al.

(10) Patent No.: US 9,141,734 B2
(45) Date of Patent: Sep. 22, 2015

(54) SYSTEM AND METHOD OF REFINING A TOPOLOGICAL INDEXED MESH

(71) Applicant: The Boeing Company, Seal Beach, CA (US)

(72) Inventors: Gregory H. DeVore, Seattle, WA (US); Mark L. Taylor, Everett, WA (US)

(73) Assignee: The Boeing Company, Chicago, IL (US)

( * ) Notice: Subject to any disclaimer, the term of this patent is extended or adjusted under 35 U.S.C. 154(b) by 339 days.

(21) Appl. No.: 13/680,476

(22) Filed: Nov. 19, 2012

(65) Prior Publication Data
US 2014/0142896 A1 May 22, 2014

(51) Int. Cl.
*G06F 17/10* (2006.01)
*G06F 7/60* (2006.01)
*G06F 17/50* (2006.01)

(52) U.S. Cl.
CPC .................. *G06F 17/5018* (2013.01)

(58) Field of Classification Search
CPC ................................... G06F 17/5018
USPC ........................................... 703/2
See application file for complete search history.

(56) References Cited

U.S. PATENT DOCUMENTS

| 5,617,322 | A   | * | 4/1997 | Yokota ............................. 700/98 |
| 6,731,287 | B1  | * | 5/2004 | Erdem ........................... 345/473 |
| 7,222,057 | B2  |   | 5/2007 | Brombolich |
| 7,702,490 | B1  | * | 4/2010 | Wu et al. ........................... 703/2 |
| 2012/0026167 | A1 | * | 2/2012 | Ran et al. ....................... 345/420 |

OTHER PUBLICATIONS

FEM (User Manual, 2010 (415 pages)).*
Yue Dong teaches an (Appearance Modeling with Data Coherency, 2011 (244 pages)).*
Tecplot, "Tecplot 360 2009—Data Format Guide" Chapter 2, available at <http://download.tecplot.com/tecio/2009/dataformat.pdf>, retrieved on Nov. 18, 2012.

* cited by examiner

*Primary Examiner* — Kamini S Shah
*Assistant Examiner* — Andre Pierre Louis (57) ABSTRACT

A method of refining a mesh includes selecting an existing coarse element having existing nodes and existing indices, inputting a quantity of refined elements to be created along an element edge, and generating a parametric grid on the existing coarse element. The method may further include placing refined nodes at parametric grid locations wherein the refined nodes have subindices linked to the existing indices. The method may additionally include deleting the existing coarse element, and creating refined elements having subindices linked to the existing indices of the existing coarse element.

18 Claims, 9 Drawing Sheets

SYSTEM AND METHOD OF REFINING A TOPOLOGICAL INDEXED MESH

FIELD

The present disclosure relates generally to finite element analysis and, more particularly, to refinement of a mesh of a finite element model.

BACKGROUND

The finite element method is a technique for simulating the response of a structure to one or more loading conditions to which the structure may be subjected during service. Finite element analysis involves the application of simulated loads on a finite element model or computer model of the structure. The finite element model is comprised of a system of elements that are interconnected at nodes to form a mesh. The elements in the mesh may be assigned material properties and/or mechanical properties representing the materials from which the structure may be formed.

The finite element model may initially be formed such that the mesh has a relatively coarse density. During the design process as the operating environment and the loading conditions on the structure become more refined, it may be determined that certain areas of the structure are subjected to higher temperatures and/or increased loading relative to other areas of the structure. In areas of high loading, it may be desirable to refine the mesh density of the finite element model as a means to improve the accuracy of the finite element analysis solution. For example, areas of the structure near holes or fillet radii may be subjected to higher stress than other areas of the structure and may require a refined mesh in such areas to accurately determine whether the stress levels in such areas are within material allowables.

Unfortunately, prior art finite element systems have several drawbacks that detract from their overall utility. For example, prior art systems generally lack the capability for generating a refined mesh and maintaining continuity between the refined mesh and an original coarse mesh with regard to loads and boundary conditions. Furthermore, prior art systems lack the capability for bi-directional mapping of material properties between a refined mesh and an original coarse mesh. Even further, prior art systems lack the capability for correlating or comparing a refined mesh with a coarse model.

As can be seen, there exists a need in the art for a system and method for increasing the level of refinement of a coarse mesh of a finite element model and returning the refined mesh to the density of the original, coarse mesh. In addition, there exists a need in the art for a system and method which provides bi-directional mapping between the refined mesh and the original coarse mesh.

SUMMARY

The above-noted needs associated with mesh refinement of finite element models are specifically addressed and alleviated by the present disclosure which provides a method of refining a coarse topological indexed mesh. The method includes selecting an existing coarse element having existing nodes and existing indices, inputting a quantity of refined elements to be created along an element edge, and generating a parametric grid on the existing coarse element. The method may further include placing refined nodes at parametric grid locations and wherein the refined nodes have subindices linked to the existing indices. The method may additionally include deleting the existing coarse element, and creating refined elements having subindices linked to the existing indices of the existing coarse element.

In a further embodiment, the method may include selecting, using a user interface, existing coarse elements having existing nodes, wherein the existing coarse element and the existing nodes have existing indices. The method may additionally include inputting, using the user interface, a quantity of refined elements to be created along a primary edge and a quantity of refined elements to be created along a secondary edge of the existing coarse elements. The method may also include generating, using a grid generator, a parametric grid on the existing coarse elements, and placing, using a node placer, refined nodes at parametric grid locations wherein the refined nodes have subindices linked to the existing indices. The method may further include deleting, using an element deleter, the existing coarse elements, and creating, using an element creator, refined elements using meshing instructions that were used to generate the existing coarse element. The refined elements may have subindices linked to the existing indices and forming a refined mesh.

Also disclosed is a processor-based system for refining a topological indexed mesh. The processor-based system may include a user interface for selecting an existing coarse element. The coarse element may have existing nodes and existing indices. The user interface may also facilitate inputting a quantity of refined elements to be created along an element direction. The processor-based system may further include a processor-based grid generator for generating a parametric grid on the existing coarse element. In addition, the processor-based system may include a processor-based node placer for placing refined nodes at parametric grid locations. The refined nodes may have subindices linked to the existing indices. The processor-based system may additionally include a processor-based element deleter for deleting the existing coarse element, and a processor-based element creator for creating refined elements using meshing instructions used in generating the existing coarse element.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein.

DETAILED DESCRIPTION

Figure 1:
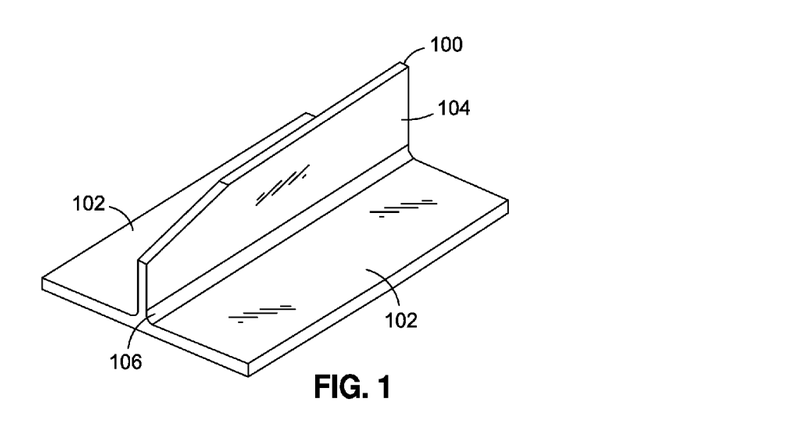
FIG. 1 is a perspective view of a workpiece.

Referring now to the drawings wherein the showings are for purposes of illustrating various embodiments of the present disclosure, shown in FIG. 1 is an example of a workpiece 100 for which a finite element model may be constructed for analysis of the workpiece 100. The workpiece 100 includes a web 102 having a rib 104 extending upwardly from the web 102. The intersection of the rib 104 with the web 102 may include fillet radii 106 between the rib 104 and the web 102.

Figures 2, 3:
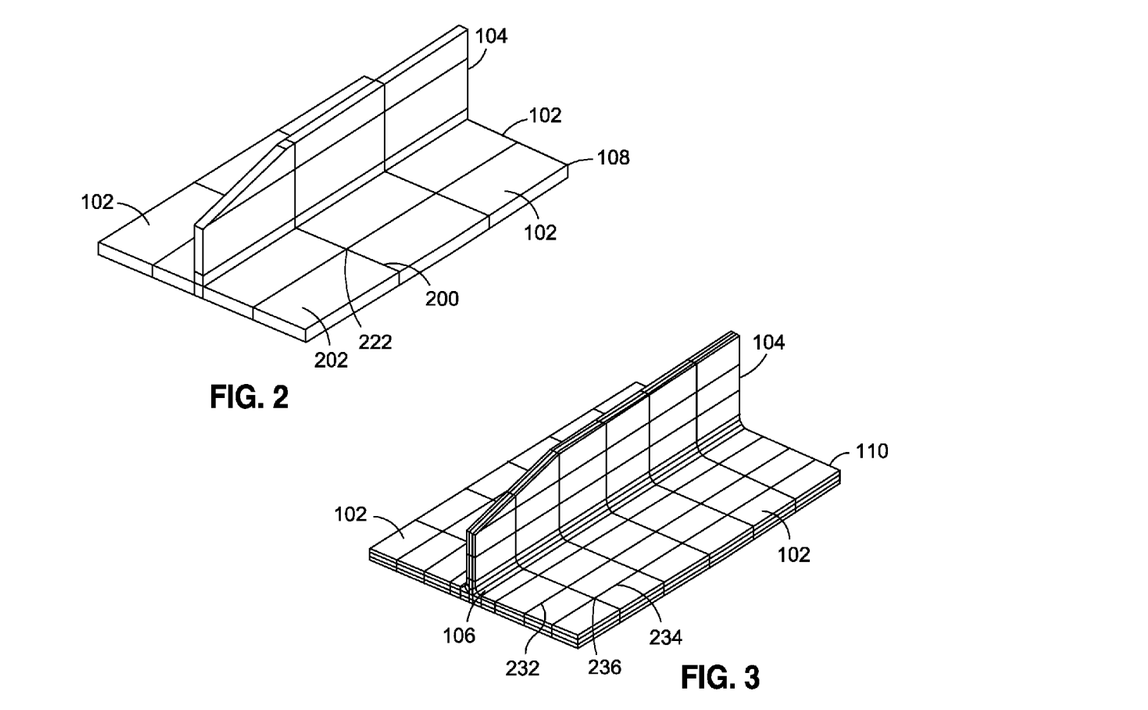
FIG. 2 is a perspective view of a finite element model of the workpiece of FIG. 1 wherein the finite element model has a coarse topological indexed mesh.
FIG. 3 is a perspective view of the finite element model of the workpiece of FIG. 1 wherein the original coarse mesh has been refined into a refined topological indexed mesh using the system and method disclosed herein.

Referring to FIG. 2, shown is a perspective view of an original coarse workpiece model 108 (i.e., a finite element model) of the workpiece 100 of FIG. 1. The original coarse workpiece model 108 includes an original coarse mesh 200 comprising an existing topological indexed mesh. The original coarse mesh 200 is made up of a plurality of an existing elements 202 interconnected to one another at existing nodes 222. The original coarse mesh 200 of the workpiece 100 model may be formed as a three-dimensional mesh. The existing elements 202 of the original coarse mesh 200 are shown as having quadrilateral shapes. However, one or more of the existing elements 202 may be formed in a triangular shape. In the present disclosure, each one of the existing elements 202 and each one of the existing nodes 222 is created with a unique set of indices defined herein as existing 220 (FIG. 5) as described below.

Referring to FIG. 3, shown is a perspective view of a refined workpiece model 110 wherein the original coarse mesh 200 (FIG. 2) has been refined into a refined mesh 232 using the system and method disclosed herein. The refined mesh 232 of the web 102 and rib 104 of the workpiece 100 in FIG. 3 has an increased quantity of refined elements 234 and refined nodes 236 relative to the quantity of existing elements 202 and existing nodes 222 in the original coarse mesh 200 of FIG. 2. In addition, the work piece model in FIG. 3 adds a refined mesh to the corner radii 106. The refinement of the mesh in FIG. 3 may improve the accuracy of the finite element analysis (FEA) solution. For example, in FIG. 3, the refined mesh 232 has an increased density relative to the mesh density in the rib 104 and web 102 of FIG. 2 which may increase the accuracy of the FEA solution. The added mesh in the corner radius 106 may provide a means for assessing the stress distribution in the corner radius 106 of the work piece 100.

Figure 7:
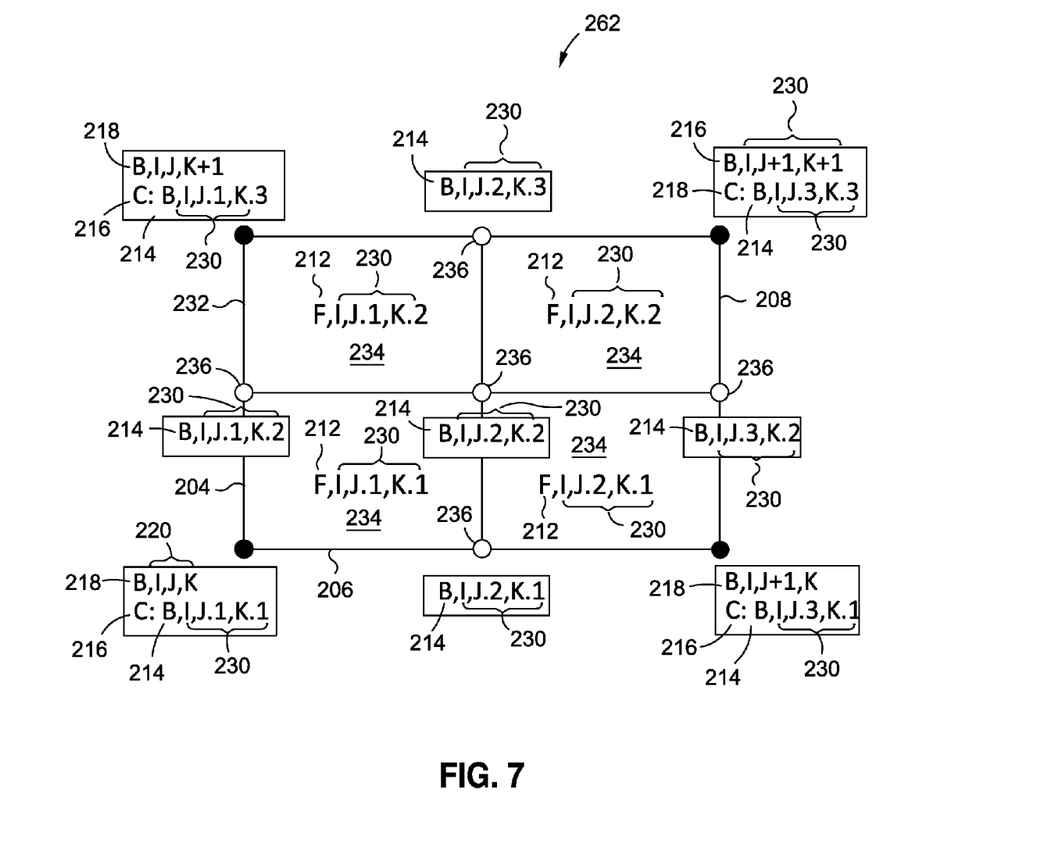
FIG. 7 is an illustration of refined nodes placed at parametric grid locations on the existing coarse element and further illustrating refined elements forming a refined mesh and wherein the refined elements have subindices that are linked to the existing indices.

Advantageously, the present disclosure implements the use of subindexing during the refinement of the original coarse mesh 200 (FIG. 2) into a refined mesh 232 (FIG. 3). In this regard, the refined mesh 232 includes a plurality of refined elements 234 and refined nodes 236 (FIG. 3) wherein each one of the refined elements 234 and refined nodes 236 has a unique set of subindices 230 (FIG. 7). As described in greater detail below, the subindices 230 of the refined elements 234 are linked to the existing indices 220 of the existing elements 202 (i.e., the coarse elements) of the original coarse mesh 200. Likewise, the subindices 230 of the refined nodes 236 are linked to the existing indices 220 (FIG. 5) of the existing nodes 222 (i.e., the coarse nodes) of the original coarse mesh 200 (FIG. 2).

The system and method disclosed herein is configured such that the numbering system (e.g., i, j, k) of the existing indices 220 is preserved in the numbering system of the subindices 230 (e.g., i.1, j.1, k.1), as described below. In this manner, the link between the existing indices 220 and the subindices 230 (FIG. 7) enables automatic data mapping from existing elements 202 to refined elements 234 (FIG. 3). The data mapping may include mapping of properties such as material properties (e.g., density, elastic modulus, etc.) that may be assigned to the existing elements 202 (FIG. 2). In addition, the link between the subindices 230 and the existing indices 220 enables relatively rapid refinement and coarsening of a mesh an unlimited number of times to any level of refinement while maintaining the links between the coarse elements 202 and the refined elements 234. The meshing refinement process as disclosed herein may be performed with the same meshing instructions that were used in generating the original coarse mesh 200. In this manner, the process of refining a mesh can be performed in a significantly reduced amount of time and with reduced complexity relative to finite element programs that lack the capability for mesh refinement and coarsening.

Figure 4:
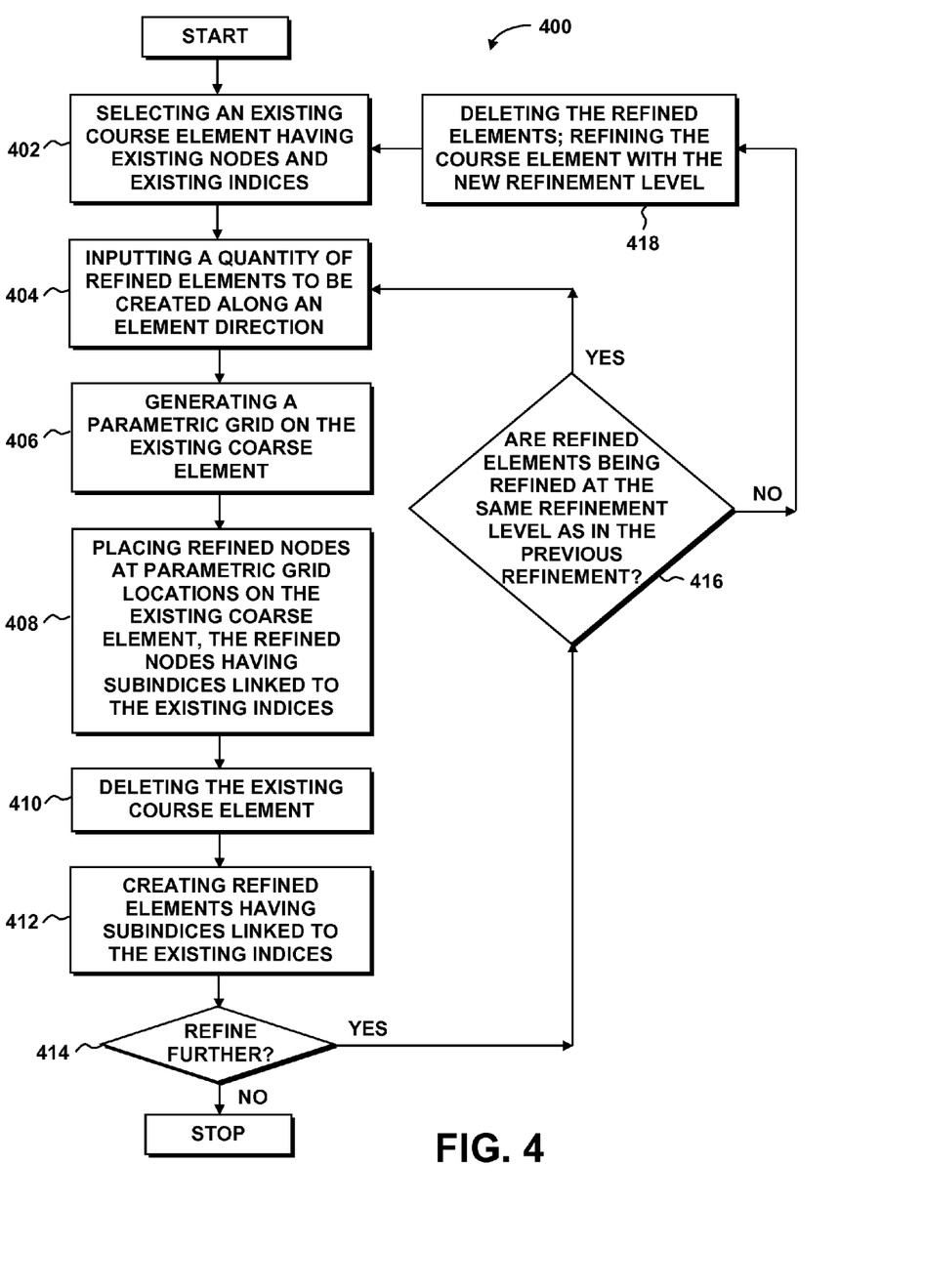
FIG. 4 is an illustration of a flow diagram having one or more operations that may be included in a method for refining a topological indexed mesh.
Figure 5:
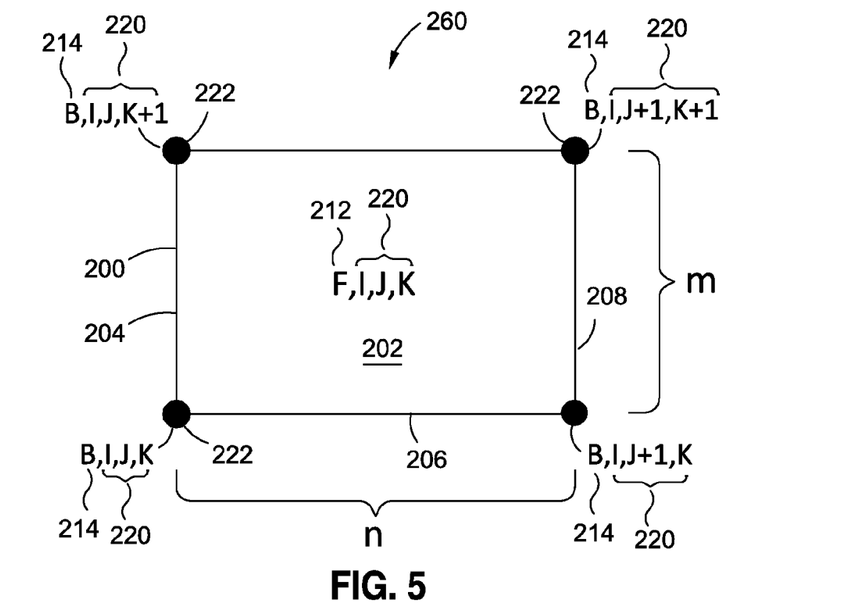
FIG. 5 is an illustration of a two-dimensional existing coarse mesh having existing nodes and an existing element with existing indices.

Referring to FIG. 4 with additional reference to FIGS. 5-17, shown in FIG. 4 is a flow diagram representing an embodiment of a method 400 for refining a topological indexed mesh. FIG. 5 illustrates an embodiment of a two-dimensional coarse mesh 260 which is illustrated as having a single existing element 202 having a quadrilateral shape with four (4) existing nodes 222. However, the method 400 (FIG. 4) may be implemented for refining any embodiment of a two-dimensional coarse mesh 200 containing any number of existing elements 202, and is not limited to refining the coarse mesh 200 embodiment shown in FIG. 5. Further in this regard, the method 400 is not limited to refining a coarse mesh 200 comprised of quadrilateral elements and may be implemented for refining a coarse mesh 200 comprised of triangular elements (not shown), or a combination of triangular elements, quadrilateral elements or other shapes. Furthermore, the method 400 may be implemented for refining one or more embodiments of a one-dimensional coarse mesh 250 (FIG. 14) and/or one or more embodiments of a three-dimensional coarse mesh 270 (FIG. 16), as described below.

Referring to FIG. 5, Step 402 of the method 400 of FIG. 4 may comprise selecting one or more existing elements 202 of an existing coarse mesh 200 for refinement. The existing coarse mesh 200 may be generated using meshing instructions. The meshing instructions may include a node connection order indicating the sequence in which to connect nodes. The meshing instructions may also include an increment in which nodes are to be connected, as described below. The existing coarse mesh 200 in FIG. 5 includes a single, existing element 202 and four (4) existing nodes 222. Depending on the type of mesh (e.g., one-dimensional, two-dimensional, three-dimensional), the existing element 202 may include one or more element edges 204. For example, the existing element 202 in FIG. 5 is bounded by a pair of primary edges 206 (e.g., m) and a pair of secondary edges 208 (e.g., n). The existing element 202 may be identified by an element family number 212 (e.g., F) followed by existing indices 220 (I, J, K). The existing nodes 222 may be defined in terms of a block identification (ID) number (e.g., B) and existing indices 220 (e.g., I, I+1, . . . , J, J+1, . . . , K, K+1, . . . ). In the present disclosure, indices may be defined in terms of Cartesian coordinates. Alternatively, indices may be defined in terms of cylindrical coordinates (r, θ, z—not shown) or other coordinate systems.

Step 404 of the method 400 of FIG. 4 may comprise inputting a quantity of refined elements 234 to be created along an element edge 204 of the existing coarse element 202. For example, the method may include inputting a quantity of n=2 refined elements 234 (FIG. 3) to be created along the primary edge 206, and a quantity of m=2 refined elements 234 to be created along the secondary edge 208 of the existing coarse element 202. In the two-dimensional coarse mesh 260 of FIG. 5, n=2, m=2 represent a refinement level 238 (FIG. 6) to which the existing coarse mesh 260 may be refined. For a one-dimensional coarse mesh 250 (FIG. 14), the method may include specifying a quantity of refined elements 234 to be created along a primary edge 206. For a three-dimensional coarse mesh 270 (FIG. 16), the method may include specifying a quantity of refined elements 234 to be created along the primary edge 206, the secondary edge 208, and a tertiary edge 210 oriented orthogonally to the primary edge 206 and the secondary edge 208.

Figure 6:
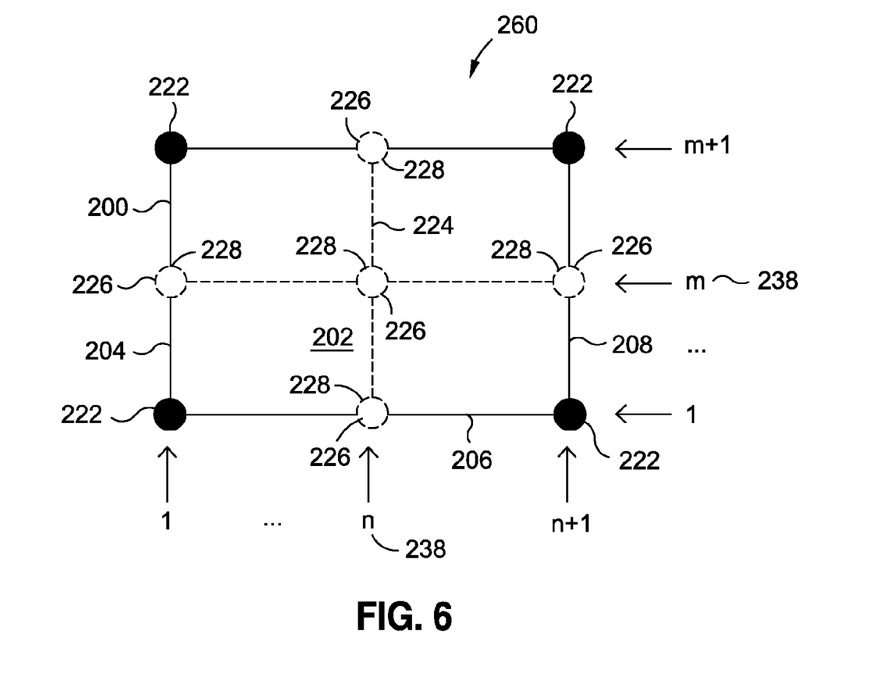
FIG. 6 is an illustration of a parametric grid applied to the existing coarse element to define locations of refined nodes.

Referring to FIG. 6, Step 406 of the method 400 of FIG. 4 may comprise generating a parametric grid 224 on the existing coarse element 202 at a previously defined refinement level 238. FIG. 6 illustrates a parametric grid 224 having a refinement level 238 of n=2, m=2 applied to the existing coarse element 202 to define locations of refined nodes 228. The parametric grid 224 results in two (2) refined elements 234 along a direction of the primary edge 206 and two (2) refined elements 234 along a direction of the secondary edge 208. It should be noted that the existing coarse element 202 may be refined using any refinement level 238. In addition, the refinement level 238 along one element edge 204 may be different than the refinement level 238 along another element edge 204. For example, although not shown, a parametric grid 224 may divide an existing coarse element 202 into three (3) refined elements 234 (e.g., m=3) along the primary edge 206 and two (2) refined elements 234 (e.g., m=2). Even further, either the primary edge 206 or the secondary edge 208 may be maintained in an undivided state (i.e., n=1 or m=1).

Referring to FIG. 7, Step 408 of the method 400 of FIG. 4 may comprise placing refined nodes 236 at parametric grid locations 226 according to the parametric grid 224 generated in Step 406. FIG. 7 illustrates refined nodes 236 placed midway along the primary edges 206 and the secondary edges 208. Each one of the refined nodes 236 has subindices 230 that are based on the existing indices 220 of the original coarse mesh 200. For example, in FIG. 7, the refined node 236 at the lower left-hand corner has a child topological ID (C) 216 indicating that the refined node 236 is a child of the parent existing node 222 (i.e., parent node) of the original coarse mesh 200.

Each one of the refined nodes 236 has a block ID number (B) 214 that is the same as the block ID number 218 of the existing node 222 (i.e., the parent node). Furthermore, each one of refined nodes 236 includes subindices 230 (FIG. 7) that are based on the existing indices 220 of the existing nodes 222 (FIG. 6) of the original coarse mesh 200. For example, the refined node 236 at the lower left hand corner of the mesh in FIG. 7 includes subindices 230 (e.g., a subindex of "0.1" behind the J and behind the K) such that the refined node 236 at the lower left hand corner is identified by (C:B, I, J.1, K.1). By identifying the refined nodes 236 with subindices 230 corresponding to the existing indices 220, the refined nodes 236 are linked to the existing nodes 222 (i.e., the coarse nodes) of the original coarse mesh 200.

Step 410 of the method 400 of FIG. 4 may comprise deleting the existing coarse elements 202 (FIG. 5) from the original coarse mesh 200 (FIG. 5). The deletion of the existing coarse elements 202 may be performed after placing refined nodes 236 (FIG. 6) at the parametric grid locations 226 (FIG. 6) in Step 406. FIGS. 5-6 illustrate the existing element 202 of the existing coarse mesh 200. FIG. 7 illustrates the removal or deletion of the existing coarse element 202.

Step 412 of the method 400 of FIG. 4 may comprise creating refined elements 234 (FIG. 7) having subindices 230 that are linked to the existing indices 220. The combination of the refined elements 234 makes up the refined mesh 232 shown in FIG. 7. In this regard, the existing coarse element 202 in FIGS. 5-6 is refined into four (4) refined elements 234 in FIG. 7. Each one of the refined elements 234 has an element family number (F) 212 that is the same as the element family number (F) 212 of the existing element 202 (i.e., the parent element). In addition, each one of the refined elements 234 is identified by subindices 230 that are based on the existing indices 220 of the existing element 202. In an embodiment, the existing indices 220 of the existing elements 202 are based on the first existing node 222 created using the meshing instructions as described below.

For example, in FIG. 5, the existing element 202 has existing indices 220 of (I, J, K) which are based on the existing indices 220 of (I, J, K) of the first existing node 222 of the original coarse mesh 200 located in the lower left hand corner. In the same regard, in FIG. 7, the refined element 234 in the lower left hand corner of the refined mesh 232 has subindices 230 (e.g., a subindex of "0.1" behind the J and behind the K) that are based on the existing indices 220 of the existing element 202 in FIG. 5. In this manner, the subindices 230 of the refined elements 234 (FIG. 7) and refined nodes 236 (FIG. 7) are linked to the corresponding existing indices 220 of the original coarse mesh 200 (FIG. 5).

In an embodiment, refined elements 234 may be created using meshing instructions that were used in creating the original coarse mesh 200. The creation of the refined elements 234 may include connecting the refined nodes 236 in a predetermined order using a predetermined level of incrementing. For example, for the two-dimensional refined mesh 262 illustrated in FIG. 7, the meshing instructions may specify a refined node 236 connection order of "+J,+K" and an increment of "1,1" which corresponds to connecting the refined nodes 236 by starting at the child refined node 236 identified as (C:B,I,J.1,K.1) and positively incrementing the J index along the primary edge 206 to the refined node 236 identified as (B,I,J.2,K.1), and then positively incrementing the K index along to the refined node 236 identified as (B,I, J.2,K.2) and then completing the remaining element edges 204 in a counterclockwise manner to create the refined element 234 identified as (F,I,J.1,K.1). The refined element 234 identified as (F,I,J.2,K.1) may then be created in the same manner, followed by creating the refined element 234 identified as (F,I,J.1,K.2), and then creating the refined element 234 identified as (F,I,J.2,K.2) to form the completed refined mesh 232.

Although not illustrated, refined meshes 232 (FIG. 2) may be created using meshing instructions having a negative connection order (e.g., −J,+K, or −J,−K, or +J,−K). Meshing instructions may provide for incrementing along at least one of the element edges by an integer value. For example, meshing instructions may provide for incrementing at an integer value of 1. However, the meshing instructions may also provide for incrementing at an integer value that is greater than 1. For example, meshing instructions may specify an increment of "2,1" corresponding to skipping over a node along the J direction when connecting pairs of nodes such as to define an element edge of a refined element.

Advantageously, by using the same meshing instructions for creating the refined mesh 232 (FIG. 7) as were used in creating the original coarse mesh 200 (FIG. 5), the refined elements 234 (FIG. 7) may have the same orientation as the existing elements 202 (FIG. 5). Maintaining the same orientation of the refined elements 234 relative to the existing elements 202 allows for consistency when extracting loads from the FEA solution at a given element. For example, in a finite element model of a cylindrical panel (not shown) subjected to axial loads and hoop loads, maintaining consistent orientation of the refined elements 234 relative to the existing elements 202 (e.g., coarse elements) ensures that the axial load direction of the refined element 234 matches the axial load direction of the existing element 202 of the original coarse mesh 200.

In FIG. 4, Step 414 of the method 400 may include a decision step for further refining a portion of the refined mesh 232 (FIG. 7) or an entirety of the refined mesh. For example, after generating a refined mesh 232 and running a computer simulation on the finite element model with the refined mesh 232 using a new load case, a review of the analysis (FEA) results may indicate that certain areas of interest in the mesh are subjected to greater stress or strain than initially predicted. As a means to improve the accuracy of the FEA solution, it may be desirable to refine the mesh in such areas of interest to a higher refinement level 238 (FIG. 6) and to keep the remaining areas of the mesh at the same refinement level 238. By limiting the refinement of the mesh to specific areas of interest, computer memory and/or computer run time may be minimized relative to the amount of computer memory and/or run time that would otherwise be required to run a computer simulation on an FEM where the entire mesh is further refined.

Figure 8:
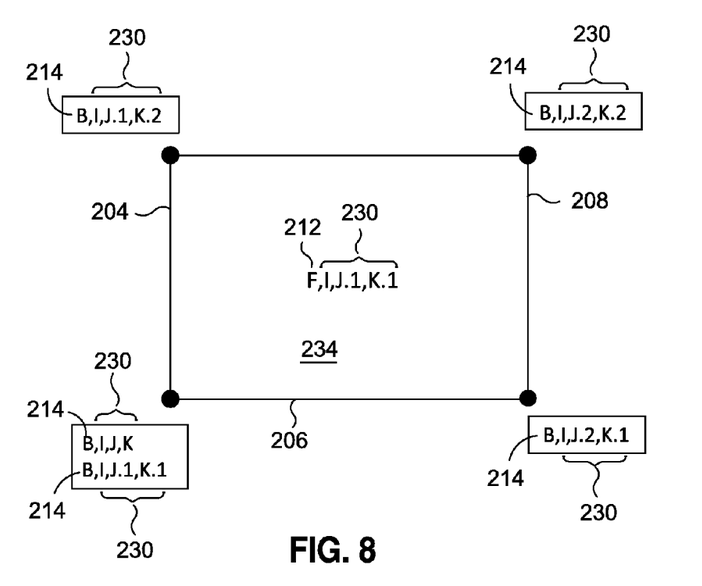
FIG. 8 is an illustration of one of the refined elements of the refined mesh of FIG. 7.
Figure 9:
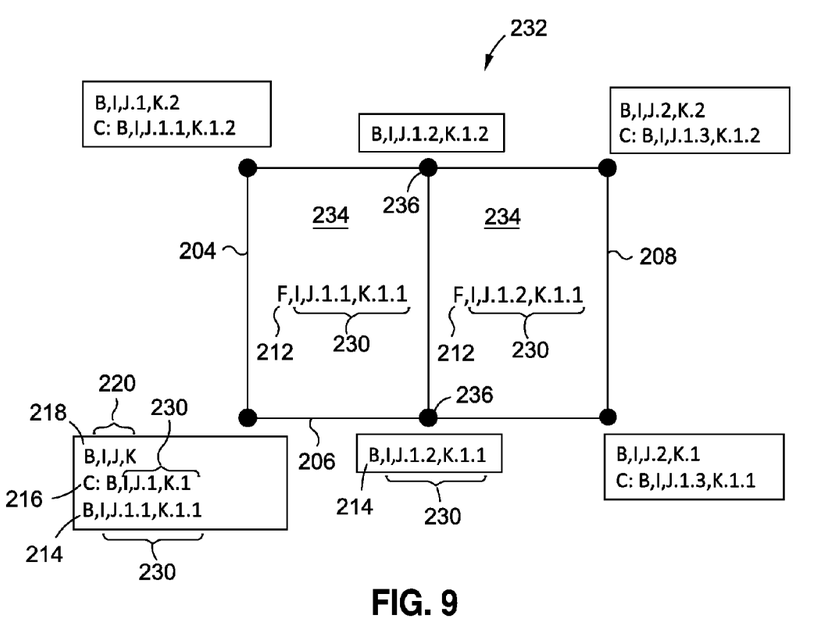
FIG. 9 is an illustration of a further refinement of one of the refined elements of FIG. 7.

Referring briefly to FIGS. 8-9, it may be determined that further refinement is required for the refined element 234 in the lower left-hand corner of the mesh (FIGS. 7-8). FIG. 8 illustrates the refined element 234 (F,I,J.1,K.1) containing nodes (e.g., B,I,J.1,K.1, . . . ) and bounded by primary edges 206 and secondary edges 208. The refinement process may follow the above-described Steps 404-412 of FIG. 4 to generate a set of further refined elements 234 and refined nodes 236 as shown in FIG. 9. Advantageously, in FIG. 9, the further refined elements 234 and refined nodes 236 have subindices 230 that are linked to the previously-created subindices 230 which, in turn, are linked to the existing indices 220 of the original coarse mesh 200 (FIG. 5).

For example, in FIG. 9, the refined element 234 has the same family number (F) as the previously created refined element 234 in FIG. 8. In addition, the left-most refined element 234 in FIG. 9 has subindices (I,J.1.1,K.1.1) that are linked to the subindices (I,J.1,K.1) of the previously-created refined element 234 in FIG. 8. Likewise, in FIG. 9, the node in the lower left hand corner has the same block ID number (B) as the previously-created subindices 230. The node in the lower left hand corner of FIG. 9 also has subindices (I,J.1.1, K.1.1) that are linked to the subindices (I,J.1,K.1) generated during the previous refinement of the refined element 234 (FIG. 8), and which are linked to the existing indices (I,J,K) of the original existing indices 220 of the original coarse mesh 200 (FIG. 5). Any number of further refinements of one or more mesh elements may be performed using the above-described process. Advantageously, the subindexing aspect of the refinement process allows for bi-directional data mapping between an original coarse mesh and a refined mesh, regardless of the level of mesh refinement. In addition, the method allows for relatively rapid coarsening of a refined mesh back to any previous level of refinement and or back to an original coarse mesh, as described below.

Figure 10:
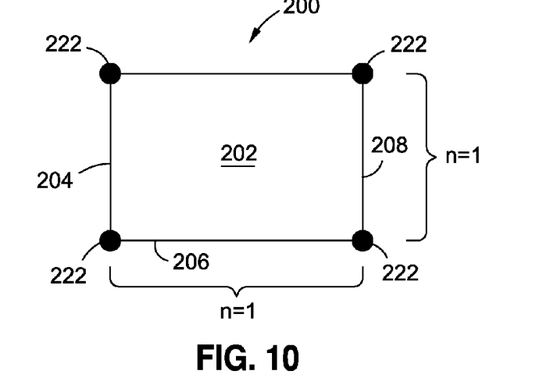
FIG. 10 is an illustration of an original coarse mesh having an existing element.
Figure 11:
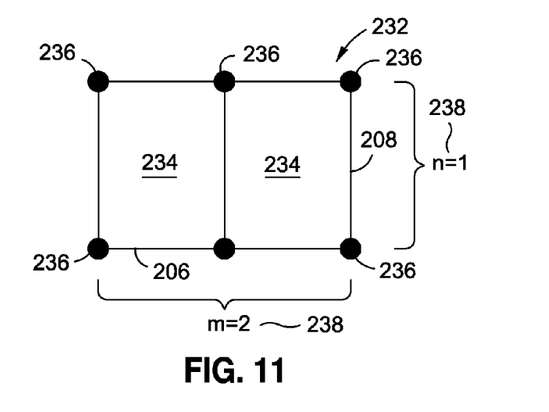
FIG. 11 is an illustration of a refined mesh formed at an increased refinement level relative to the original coarse mesh of FIG. 10.
Figure 12:
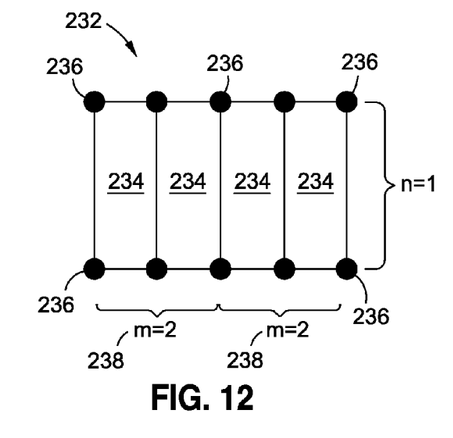
FIG. 12 is an illustration of a refined mesh formed at a new refinement level that is different than the previous refinement level of the refined mesh of FIG. 11.

Referring to FIGS. 10-13, Step 416 of the method 400 may include a decision step prior to further refining a refined mesh. In this regard, Step 416 may include determining whether all of the refined elements 234 are being further refined to a new refinement level 238 that is equivalent to the previous refinement level 238. For example, shown in FIG. 10 is an original coarse mesh 200 having a single existing element 202. FIG. 11 illustrates a refined mesh 232 created from the original coarse mesh 200 of FIG. 10. The refined mesh 232 in FIG. 11 includes two (2) refined elements 234 representing a refinement level 238 of m=2, n=1 relative to the single existing element 202 of FIG. 10. In the method disclosed herein, if all of the refined elements 234 of a refined mesh 232 are being further refined to a new refinement level 238 that is equivalent to the previous refinement level 238, (i.e., the most recent refinement), the method requires refining each refined element 234 by performing Steps 404 to 414 on the refined elements 234. For example, FIG. 11 illustrates a refined mesh 232 created from the original coarse mesh 200 (FIG. 10) at a refinement level 238 of m=2, n=1 as indicated above. FIG. 12 illustrates a further refined mesh 232 also having a refinement level 238 of m=2, n=1, which is equivalent to the m=2, n=1 refinement level 238 of FIG. 11. In this regard, the further refined mesh 232 of FIG. 12 may be created by performing steps 404 to 414 on the refined elements 234.

Figure 13:
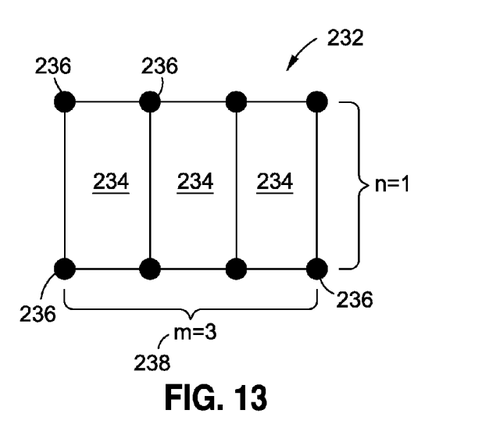
FIG. 13 is an illustration of a further refined mesh containing two refined elements wherein each refined element is formed at a refinement level that is the same as the previous refinement level of the refined mesh of FIG. 11.

In FIG. 4, Step 416 of the method 400 requires that if all of the refined elements 234 of a refined mesh 232 are being further refined to a new refinement level 238 that is different than the previous refinement level 238, (i.e., the most recent refinement), the method requires performing Step 418 of the method. In such a case, Step 418 requires deleting the existing refined elements 234, and refining the original coarse mesh 200 by performing Steps 402 to 414 on the refined elements 234. For example, as indicated above, FIG. 11 illustrates a refined mesh 232 created from the original coarse mesh 200 (FIG. 10) at a refinement level 238 of m=2, n=1. FIG. 13 illustrates a further refined mesh 232 having a refinement level 238 of m=3, n=1, which is different than the m=2, n=1 refinement level 238 of FIG. 11. In this regard, the further refined mesh 232 of FIG. 12 may be created by deleting the refined elements 234 from the refined mesh of FIG. 11, and forming new refined elements 234 at the new refinement level 238 by performing Steps 402 to 414 on the original coarse element 202 (FIG. 10). Advantageously, the link between the subindices 230 and the existing indices 220 enables reverting to a previous refinement level and/or refining at a further refinement level an unlimited number of times and to any level of refinement.

In a further embodiment not shown, the method may include reverting a refined mesh 232 (FIG. 7) back to an original coarse mesh 200 (FIG. 5) or back to previous refinement level 238 (FIGS. 11-12). Advantageously, the link between the subindices 230 (FIG. 7) of the refined mesh 232 with the existing indices 220 (FIG. 5) of an original coarse mesh 200 enables relatively rapid coarsening of a refined mesh 232 while maintaining links between the coarse elements 202 (FIG. 5) and the refined elements 234 (FIG. 7). The coarsening of a mesh may comprise deleting the subindices 230 of refined nodes 236 and refined elements 234, and repopulating the mesh with the original existing indices 220 such that the mesh contains the original elements of the original coarse mesh 200. In addition, the coarsening of the mesh may comprise reverting the mesh back to a previous refinement level 238 that may be intermediate the density of the original coarse mesh 200.

Figure 14:
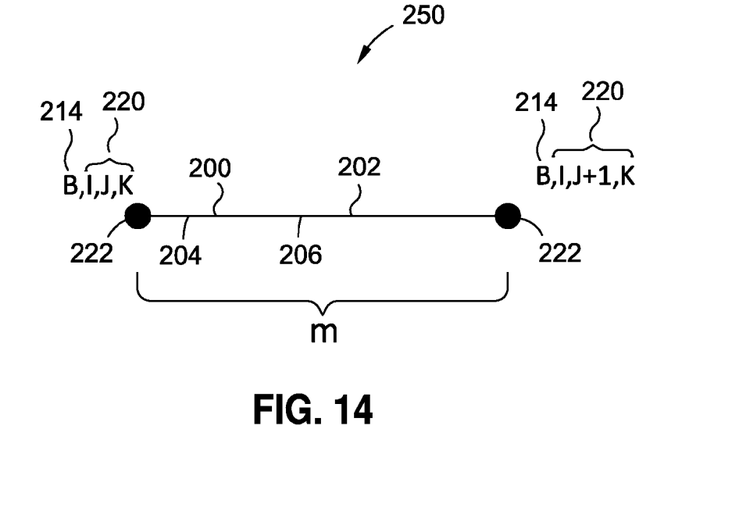
FIG. 14 is an illustration of a one-dimensional original coarse mesh.

Referring briefly to FIG. 14, shown is a one-dimensional original coarse mesh 200 having a pair of existing nodes 222 and a single existing element 202 to which the method 400 may be applied. As indicated above, the method of refining a one-dimensional coarse mesh 250 may include specifying a quantity of refined elements 234 (FIG. 15) to be created along an element edge 204 (FIG. 14) of the existing element 202 (FIG. 14).

Figure 15:
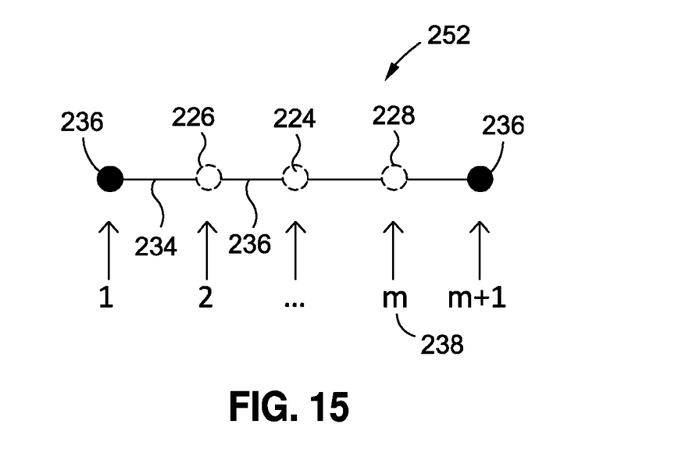
FIG. 15 is an illustration of a one-dimensional refined mesh formed from the one-dimensional original coarse mesh of FIG. 14.

FIG. 15 illustrates a one-dimensional refined mesh 252 based on the one-dimensional original coarse mesh 250 of FIG. 14. The one-dimensional refined mesh 252 may be created by performing Step 402 to 414 of the method 400 of FIG. 4. For example, a value may be entered for the quantity of refined elements 234 to be created along the element edge 204. A parametric grid 224 may be generated on the existing coarse element 202 (FIG. 14), and refined nodes 236 may be placed at the parametric grid locations 226. The existing coarse element 202 may be deleted and refined elements 234 may be generated using meshing instructions such as those that were used in generating the existing coarse element 202. The refined mesh 232 may be further refined or coarsened any number of times as indicated above.

Figure 16:
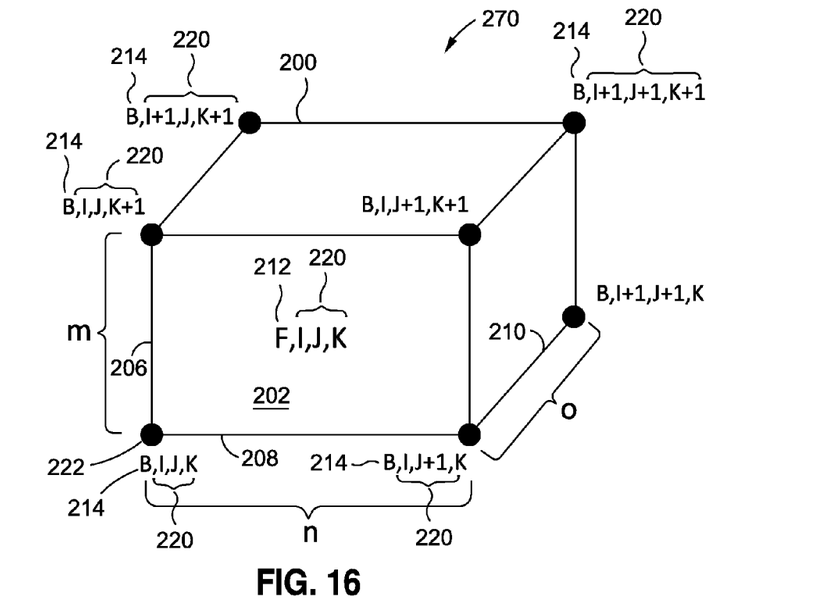
FIG. 16 is an illustration of a three-dimensional original coarse mesh.
Figure 17:
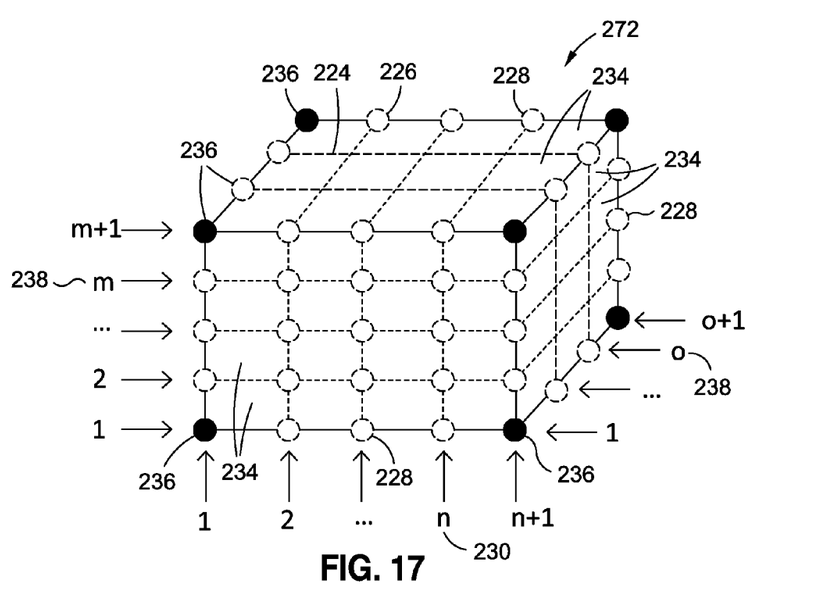
FIG. 17 is an illustration of a three-dimensional refined mesh formed from the three-dimensional original coarse mesh of FIG. 16.

Referring briefly to FIG. 16, shown is a three-dimensional mesh 270 having primary edges 206, secondary edges 208, and tertiary edges 210 oriented orthogonally to the primary and secondary edges 206, 208. The method of refining the three-dimensional original coarse mesh 270 may include specifying the quantity of refined elements 234 (FIG. 17) to be created along the primary, secondary, and tertiary edges 206, 208, 210. A parametric grid 224 may be generated for determining locations of refined nodes 228. The existing coarse elements 202 may be deleted and refined elements 234 may be generated in the same manner described above to create a one-dimensional refined mesh 252 or a two-dimensional refined mesh 262.

Figure 18:
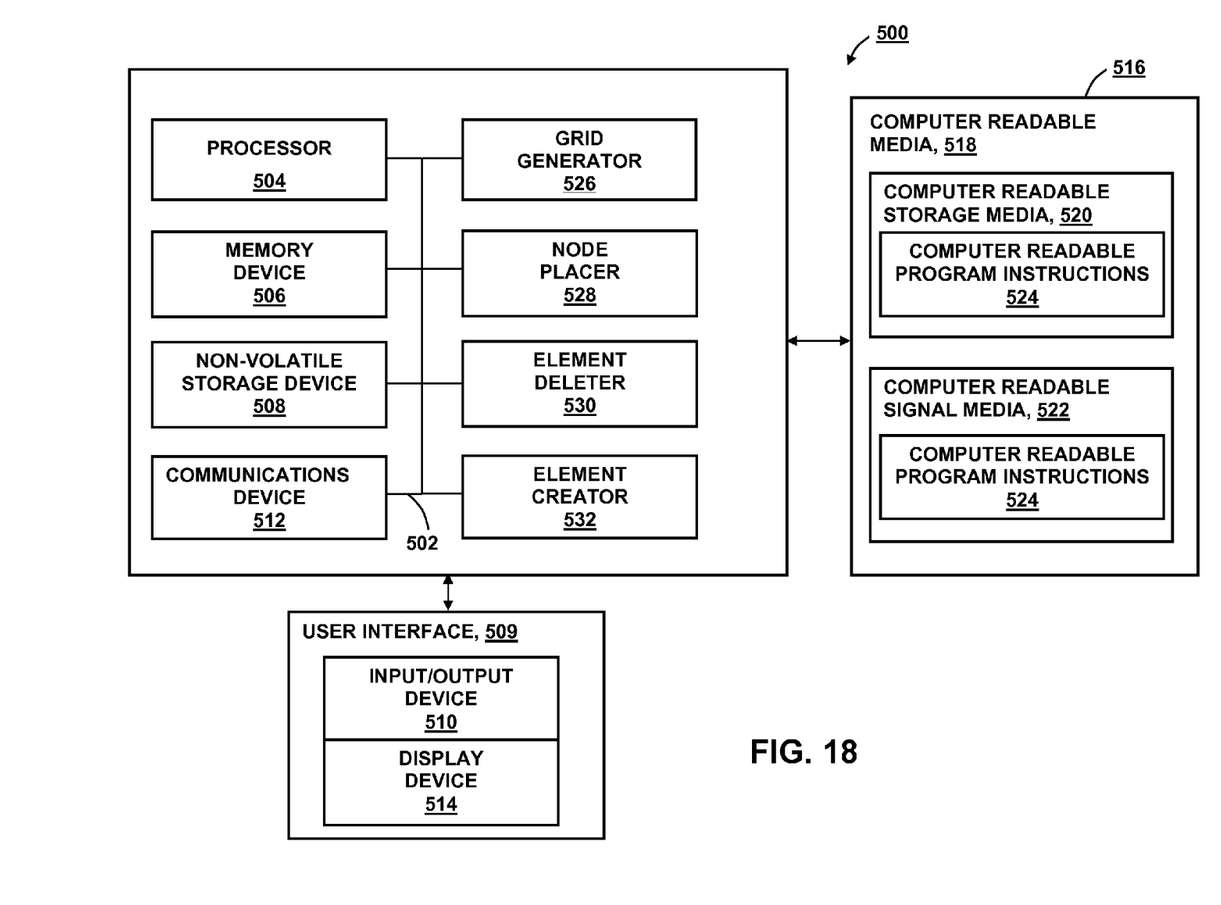
FIG. 18 is a block diagram of a processor-based system for refining a topological indexed mesh.

Referring to FIG. 18, the above-described steps of the disclosed method (FIG. 4) or any combination of the steps, in whole or in part, may be implemented in a computer-implemented process such as on a processor-based system 500 or other suitable computer system. The processor-based system 500 may perform computable readable program instructions 524. The computable readable program instructions 524 may be provided to or loaded onto the processor-based system 500 in order to implement one or more of the above-described operations or steps. In a non-limiting example, the processor-based system 500 and/or the computable readable program instructions 524 may facilitate the refinement of a topological indexed mesh as indicated above.

The block diagram of FIG. 18 illustrates the processor-based system 500 in an advantageous embodiment that may be used to refine one or more existing coarse elements 202 (FIG. 5) into a plurality of refined elements 234 (FIG. 7). The processor-based system 500 may include a data communication path 502 (e.g., data link) to communicatively couple one or more components to facilitate transfer of data between such components. In an embodiment, the communication path 502 may comprise one or more data buses or any other suitable communication path that facilitates the transfer of data between the components and devices of the processor-based system 500.

In a non-limiting embodiment of the processor-based system 500 (FIG. 18), the components may include one or more of a processor 504, a memory device 506, a non-volatile storage device 508, a communications device 512, a user interface 509 having an input/output device 510 and a display device 514, a grid generator 526, a node placer 528, an element deleter 530, and an element creator 532. The display device may display an existing coarse mesh 200 (FIG. 5) of a finite element model. The user interface 509 may facilitate the selection of one or more existing coarse elements 202 (FIG. 5) of the existing coarse mesh 200 displayed on the display device 514. The quantity of refined elements 234 (FIG. 7) to be created may represent a desired refinement level 238 (FIG. 6) for the existing coarse mesh 200. The user interface 509 may facilitate inputting a quantity of refined elements 234 to be created along an element edge 204 (FIG. 5) of an existing coarse element 202. For example, the user interface 509 may facilitate inputting a quantity of refined elements 234 to be created along a primary edge 206 (FIG. 5) and a secondary edge 208 (FIG. 5) of one or more existing coarse elements 202 of a two-dimensional coarse mesh 260 (FIGS. 5-6), and on a tertiary edge 210 (FIG. 16) of a three-dimensional coarse mesh 270 (FIG. 16).

The grid generator 526 may generate a parametric grid 224 (FIG. 6) on the existing coarse element 202 (FIG. 6) at the refinement level 238 (FIG. 6). The parametric grid 224 may be displayed on the display device 514 to provide an observer with a visual indication of the mesh density of a refined mesh that may be created at the refinement level 238 represented by the parametric grid 224.

The node placer 528 may place refined nodes 236 (FIG. 7) at parametric grid locations 226 (FIG. 6) on the existing coarse element 202 (FIG. 6). As indicated above, the refined nodes 236 have subindices 230 (FIG. 7) that are advantageously linked to the existing indices 220 (FIG. 7) of the existing nodes 222 (FIG. 5) of the existing coarse mesh 200 (FIG. 5). The element deleter 530 may delete the existing coarse element 202 after the refined nodes 236 are placed at the parametric grid locations 226. The element creator 532 may create refined elements 234 (FIG. 7) using meshing instructions which may be the same meshing instructions used in generating the existing coarse element 202. The refined elements 234 and refined nodes 236 collectively form the refined mesh 232.

The refined elements 234 advantageously include subindices 230 (FIG. 7) that are linked to the existing indices 220 (FIG. 7), as indicated above. In this regard, the processor-based system 500 may be configured to store the element family number 212 (FIG. 7) of the existing elements 202 (FIG. 5) and the refined elements 234 (FIG. 7), the subindices 230 of the existing elements 202, and the subindices 230 of the refined elements 234 in a database (not shown). The processor-based system 500 may also be configured to store the block ID number 214 (FIG. 7) of the existing nodes 222 (FIG. 5) and refined nodes 236 (FIG. 7), the existing indices 220 of the existing nodes 222, and the subindices 230 of the refined nodes 236.

In addition, the processor-based system 500 may be configured to store the meshing instructions for generating the refined mesh 232 including the order in which to connect the refined nodes 236 and the increment at which the refined nodes 236 are connected as described above. In this manner, the meshing instructions may be called to allow for creation of the refined mesh. The element creator 532 is configured to connect the refined nodes 236 in a predetermined order. In addition, the element creator 532 is configured to increment along at least one of the element directions (i.e., along an element edge) by an integer value such as a value of 1. However, in an embodiment, the element creator 532 is configured to increment at an integer value greater than 1.

The processor-based system 500 may be configured to further refine each one of the refined elements 234 as illustrated in FIGS. 10-13. For example, if all of the refined elements 234 of a refined mesh 232 are being further refined to a new refinement level 238 that is equivalent (FIGS. 11-12) to a previous refinement level 238, the processor-based system 500 is configured to further refine the refined elements 234 at the new refinement level 238. If all of the refined elements 234 of a refined mesh 232 are being further refined to a new refinement level 238 that is different (FIGS. 11 and 13) than a previous refinement level 238, the processor-based system 500 is configured to delete the existing refined elements 234 and generate new refined elements 234 at the new refinement level 238. In a further embodiment, the system is configured to revert the refined mesh 232 back to an original coarse mesh 200 by deleting the refined elements 234 and repopulating with existing elements 202. Advantageously, the reverting back to the original coarse mesh 200 is facilitated by the links between the subindices 230 of the refined mesh 232 and the existing indices 220 of the original coarse mesh 200.

The processor-based system 500 (FIG. 18) may include one or more of the input/output devices 406 (FIG. 18) to facilitate the transfer of data between components that may be connected to the processor-based system 500. The input/output device 510 may be communicatively coupled to the processor-based system 500. The input/output device 510 may facilitate user-input via the user interface 509 (FIG. 18) by means of a peripheral device such as a keyboard, a mouse, a joystick, a touch screen and any other suitable device for inputting data from the user interface 509 into the processor-based system 500. The input/output device 510 may further include an output device for transferring data representative of the output of the processor-based system 500. For example the input/output device 510 may comprise the display device 514 such as a computer monitor or a computer screen for displaying a refined mesh 232 (FIG. 7) generated by the processor-based system 500. The input/output device 510 may optionally include a printer or fax machine for printing a hardcopy of information processed by the processor-based system 500.

In an embodiment, the processor-based system 500 may include one or more of the processors 504 for executing instructions of computable readable program instructions 524 that may be installed into the memory device 506. Alternatively, the processor 504 may comprise a multi-processor core having two or more integrated processors cores. Even further, the processor 504 may comprise a main processor and one or more secondary processors integrated on a chip. The processor 504 may also comprise a many-processor system having a plurality of similarly configured processors.

Referring still to FIG. 18, the processor-based system 500 may further include one or more memory devices 506 which may comprise one or more of volatile or non-volatile storage devices 508. However, the memory device 506 may comprise any hardware device for storing data. For example, the memory device 506 may comprise a random access memory or a cache of an interface and/or integrated memory controller hub which may be included in the communication path 502. The memory device 506 may be configured to permanently and/or temporarily store any one of a variety of different types of data, computer readable code or program instructions 524, or any other type of information. The non-volatile storage device 508 may be provided in a variety of configurations including, but not limited to, a flash memory device, a hard drive, an optical disk, a hard disk, a magnetic tape or any other suitable embodiment for long-term storage. In addition, the non-volatile storage device 508 may comprise a removable device such as a removable hard drive.

Referring still to FIG. 18, the processor-based system 500 may include one or more communications devices 512 to facilitate communication of the processor-based system 500 within a computer network and/or with other processor-based systems. Communication of the processor-based system 500 with a computer network or with other processor-based systems may be by wireless means and/or by hardwire connection. For example, the communications device 512 may comprise a network interface controller to enable wireless or cable communication between the processor-based system 500 and a computer network. The communications device may also comprise a modem and/or a network adapter or any one of a variety of alternative device for transmitting and receiving data.

One or more of the operations of the methodology described above for refining a topological indexed mesh may be performed by the processor 504 and/or by the grid generator 526, the node placer 528, the element deleter 530, and/or the element creator 532 using the computer readable program instructions 524. The computer readable program instructions 524 may comprise program code which may include computer usable program code and computer readable program code. The computer readable program instructions 524 may be read and executed by the processor 504. The computer readable program instructions 524 may enable the processor 504 to perform one or more operations of the above-described embodiments associated with refining a topological indexed mesh and/or coarsening a refined mesh.

Referring still to FIG. 18, the computer readable program instructions 524 may include operating instructions for the processor-based system 500 and may further include applications and programs. The computer readable program instructions 524 may be contained and/or loaded onto one or more of memory devices 506 and/or non-volatile storage devices 508 for execution by the processor 504. As indicated above, one or more of the memory devices 506 and/or non-volatile storage devices 508 may be communicatively coupled to one or more of the remaining components illustrated in FIG. 18 through the communication path 502.

The computer readable program instructions 524 may be contained on tangible or non-tangible computer readable media 518 and which may be loaded onto or transferred to the processor-based system 500 for execution by the processor 504. The computer readable program instructions 524 and the computer readable media 518 comprise a computer program product 516. In an embodiment, the computer readable media 518 may comprise computer readable storage media 520 and/or computer readable signal media 522.

The computer readable storage media 520 may comprise a variety of different embodiments including, but not limited to, optical disks and magnetic disks that may be loaded into a drive, a flash memory device or other storage device or hardware for transfer of data onto a storage device such as a hard drive. The computer readable storage media 520 may be non-removably installed on the processor-based system 500. The computer readable storage media 520 may comprise any suitable storage media and may include, without limitation, a semiconductor system or a propagation medium. In this regard, the computer readable storage media 520 may comprise electronic media, magnetic media, optical media, electromagnetic media, and infrared media. For example, the computer readable storage media 520 may comprise magnetic tape, a computer diskette, random access memory and read-only memory. Non-limiting examples of embodiments of optical disks may include compact disks—read only memory, compact disk—read/write, and digital video disks.

The computer readable signal media 522 may contain the computer readable program instructions 524 and may be embodied in a variety of data signal configurations including, but not limited to, an electromagnetic signal and an optical signal. Such data signals may be transmitted by any suitable communications link including by wireless or hardwire means. For example, the hardwire means may comprise an optical fiber cable, a coaxial cable, a signal wire and any other suitable means for transmitting the data by wireless or by physical means.

Referring still to FIG. 18, the computer readable signal media 522 may facilitate the downloading of the computer readable program instructions 524 to the non-volatile storage or other suitable storage or memory device for use within processor-based system 500. For example, the computer readable program instructions 524 contained within the computer readable storage media 520 may be downloaded to the processor-based system 500 over a computer network from a server or client computer of another system.

Any one of a variety of different embodiments of the processor-based system 500 may be implemented using any hardware device or system capable of executing the computer readable program instructions 524. For example, the processor 504 may comprise a hardware unit configured for performing one or more particular functions wherein the computer readable program instructions 524 for performing the functions may be pre-loaded into the memory device 506.

In an embodiment, the processor 504 may comprise an application specific integrated circuit (ASIC), a programmable logic device, or any other hardware device configured to perform one or more specific functions or operations. For example, a programmable logic device may be temporarily or permanently programmed to perform one or more of the operations related to the methodology of refining a topological mesh. The programmable logic device may comprise a programmable logic array, programmable array logic, a field programmable logic array, and a field programmable gate array and any other suitable logic device, without limitation. In an embodiment, the computer readable program instructions 524 may be operated by the one or more processor 504 and/or by other devices including one or more hardware units in communication with the processor 504. Certain portions of the computer readable program instructions 524 may be the processor 504 and other portions of the computer readable program instructions 524 may be run by the hardware units.

Advantageously, the various embodiments of the system 500 (FIG. 18) and methods (e.g., FIG. 4) described above include the technical feature of subindexing on a topological indexed mesh with the technical effect of enabling the topological indexed mesh to be rapidly refined and coarsened an unlimited number of times while maintaining a link between the refined elements and the original existing coarse elements. The technical feature of subindexing the topological indexed mesh also provides the additional technical effect of reducing the amount of time required to adjust the mesh density of one or more portions of a finite element model.

Furthermore, the technical feature of subindexing the topological indexed mesh also results in the technical effect of providing the capability to generate two or more finite element models that sharing common indexing between the elements. For example, during the design of a vehicle, a relatively coarse level model (i.e., a loads FEM) of the entire vehicle may be developed for use in predicting the general overall behavior of the vehicle to different loading conditions and/or to analyze major load path transfers within the vehicle. For detailed stress analysis of the structural components of the vehicle, the vehicle level loads model may be refined into one or more detailed design models (i.e., a detailed design FEM) using the mesh refinement system and method disclosed herein. The technical feature of subindexing to link the coarse loads model to the refined detail design model(s) provides the technical effect of allowing properties and loads to be better compared between the two models which results in a significant improvement in the accuracy of stress analysis of the vehicle with a significant reduction in analysis time relative to prior art analysis methods.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A computer-enabled method for refining a topological indexed mesh, comprising the steps of:
    (a) selecting, using a user interface, an existing coarse element of an existing coarse mesh having existing nodes and existing indices;
    (b) inputting, using the user interface, a quantity of refined elements to be created along an element edge;
    (c) generating, using a grid generator, a parametric grid on the existing coarse element;
    (d) placing, using a node placer, refined nodes at parametric grid locations, and having subindices linked to the existing indices;
    (e) deleting, using an element deleter, the existing coarse element;
    (f) creating, using an element creator, the refined elements of a refined mesh having subindices linked to the existing indices;
    (g) reverting the refined mesh to the original coarse mesh based on one or more links between the subindices of the refined mesh and the existing indices of the existing coarse mesh to generate a coarse mesh of a finite element model while maintaining the links between the refined elements and the existing course elements.

2. The method of claim 1, wherein the step of creating refined elements comprises:
    connecting the refined nodes in a predetermined order.

3. The method of claim 2 wherein the step of connecting refined nodes in the predetermined order comprises:
    incrementing along at least one of the element edges by an integer value.

4. The method of claim 3, wherein the step of incrementing comprises:
    incrementing at an integer value greater than 1.

5. The method of claim 1, further comprising the step of further refining the mesh to a new refinement level wherein:

if all of the refined elements are being further refined to a new refinement level that is equivalent to a previous refinement level, performing the step of:
repeating steps (b) through (e) for the refined elements using the previous refinement level.

6. The method of claim 1, further comprising the step of further refining the mesh to a new refinement level wherein:
if all of the refined elements are being further refined to a new refinement level that is different than a previous refinement level, performing the steps of:
deleting the existing refined elements; and
performing steps (a) through (e) using the new refinement level.

7. The method of claim 1, wherein the mesh comprises a two-dimensional coarse mesh, the step of inputting a quantity of refined elements comprises:
inputting a quantity of refined elements to be created along a primary edge and a secondary edge of the existing coarse element.

8. The method of claim 1, wherein the mesh comprises a three-dimensional coarse mesh, the step of inputting a quantity of refined elements comprises:
inputting a quantity of refined elements to be created along a primary edge, a secondary edge, and a tertiary edge of the existing coarse element.

9. The method of claim 1, wherein the indices are in terms of Cartesian coordinates or cylindrical coordinates.

10. A computer-enabled method for refining a topological indexed mesh, comprising the steps of:
(a) selecting, using a user interface, existing coarse elements of an existing coarse mesh having existing nodes, the existing coarse element and the existing nodes having existing indices;
(b) inputting, using the user interface, a quantity of refined elements to be created along a primary edge and a quantity of refined elements to be created along a secondary edge of the existing coarse elements;
(c) generating, using a grid generator, a parametric grid on the existing coarse elements;
(d) placing, using a node placer, refined nodes at parametric grid locations, the refined nodes having subindices linked to the existing indices;
(e) deleting, using an element deleter, the existing coarse elements;
(f) creating, using an element creator, refined elements using meshing instructions that were used to generate the existing coarse element, the refined elements having subindices linked to the existing indices and forming a refined mesh; and
(g) reverting the refined mesh to the original coarse mesh based on one or more links between the subindices of the refined mesh and the existing indices of the existing coarse mesh to generate a coarse mesh of a finite element model while maintaining the links between the refined elements and the existing course elements.

11. A processor-based system for refining a topological indexed mesh, comprising:
a user interface for selecting an existing coarse element of an existing coarse mesh having existing nodes and existing indices, and for inputting a quantity of refined elements to be created;
a processor-based grid generator for generating a parametric grid on the existing coarse element;
a processor-based node placer for placing refined nodes at parametric grid locations, the refined nodes having subindices linked to existing indices of existing nodes;
a processor-based element deleter for deleting the existing coarse element;
a processor-based element creator for creating refined elements of a refined mesh using meshing instructions used in generating the existing coarse element, the refined elements having subindices linked to the existing indices and forming a refined mesh; and
the system reverting the refined mesh to the original coarse mesh based on one or more links between the subindices of the refined mesh and the existing indices of the existing coarse mesh to generate a coarse mesh of a finite element model while maintaining the links between the refined elements and the existing course elements.

12. The system of claim 11, wherein:
the element creator is configured to connect the refined nodes in a predetermined order.

13. The system of claim 11, wherein:
the element creator is configured to increment along at least one element direction by an integer value.

14. The system of claim 13, wherein:
the element creator is configured to increment at an integer value greater than 1.

15. The system of claim 11, wherein if all of the refined elements are being further refined to a new refinement level that is equivalent to a previous refinement level:
the system is configured to further refine each one of the refined elements at a new refinement level.

16. The system of claim 15, wherein if all of the refined elements are being further refined to a new refinement level that is different that a previous refinement level:
the system is configured to delete the refined elements and generate new refined elements at a new refinement level.

17. The system of claim 11, wherein:
the mesh comprises a two-dimensional coarse mesh; and
the user interface facilitating the inputting of a quantity of refined elements to be created along a primary edge and a secondary edge of the existing coarse element.

18. The system of claim 11, wherein:
the mesh comprises a three-dimensional coarse mesh; and
the user interface facilitating the inputting of a quantity of refined elements to be created along a primary edge, a secondary edge, and a tertiary edge of the existing coarse element.

* * * * *